United States Patent [19]

Higuchi

[11] Patent Number: 5,079,224
[45] Date of Patent: Jan. 7, 1992

[54] PRODUCTION METHOD OF SUPERCONDUCTIVE THIN FILM AND A DEVICE THEREOF

[75] Inventor: Fuminori Higuchi, Osaka, Japan

[73] Assignee: Sumitomo Electric Industries, Ltd., Osaka, Japan

[21] Appl. No.: 598,754

[22] Filed: Oct. 15, 1990

Related U.S. Application Data

[63] Continuation of Ser. No. 176,336, Mar. 31, 1988, abandoned.

[30] Foreign Application Priority Data

Mar. 31, 1987 [JP] Japan ............................ 62-80027

[51] Int. Cl.$^5$ .................... B05D 5/12; C23C 14/00
[52] U.S. Cl. ............................... 505/1; 29/599;
204/192.11; 204/192.29; 204/192.31; 427/38;
118/723
[58] Field of Search .................. 29/599; 118/723, 726;
204/192.11, 192.24, 192.31; 427/38; 505/1

[56] References Cited

U.S. PATENT DOCUMENTS

| | | | |
|---|---|---|---|
| 3,326,718 | 6/1967 | Dill | 29/825 X |
| 3,549,416 | 12/1970 | Rump et al. | 204/192.24 X |
| 4,129,166 | 12/1978 | Sigsbee | 29/599 X |
| 4,197,573 | 4/1979 | Morimoto | 204/298.05 X |
| 4,197,814 | 4/1980 | Takagi et al. | 204/298.05 X |
| 4,213,844 | 7/1980 | Morimoto et al. | 204/192.31 X |
| 4,692,230 | 9/1987 | Nihei et al. | 204/192.11 X |
| 4,793,908 | 12/1988 | Scott et al. | 204/192.11 X |
| 4,861,750 | 8/1989 | Nogawa et al. | 505/1 |
| 4,882,023 | 11/1989 | Wendman | 427/38 X |
| 4,950,642 | 8/1990 | Okamoto et al. | 505/1 |

OTHER PUBLICATIONS

J. Low Temp. Physics, vol. 28, Nos. 5/6 1977, pp. 535-549, by Cadieu et al.
J. Appl. Phys. 61(10) May 15, 1987, pp. 4829-4834, by Hertel et al.
Materials Research Soc. Symposium Proc., vol. 99, High Temp. Superconductors, eds. Brodsky et al., pp. 343-346, (Symposium held Nov. 30-Dec. 4, 1987 in Boston, MA.
Nb$_3$Al Thin-Film Synthesis by Electron Beam Evaportion, by Kwo et al., J. Appl. Phys. 51(3), Mar. 1980, pp. 1726-1732.
Recent Progress on LADA Growth of HgCdTe and CdTe Epitaxial Layers, by J. T. Cheung, J. Vac. Sci. Technol. A1(3), Jul.-Sep. 1983, pp. 1604-1607.
Prep. of Y-Ba-Cu Oxide Superconductor Thin Films Using Pulsed Laser Evaporation, by Dijkkamp et al., Appl. Phys. Lett. 51(8), Aug. 24, 1987, pp. 619-621.
Deposition of $Sr_xLa_{2-x}CuO_{4-y}$ Thin Films by Sputtering, by N. Terada et al., Jap. J. Appl. Physics 26 L508 (1987).
Hall Effect in Superconducting $(La_{1-x}Sr_x)_2CuO_4$ Single Crystal Thin Films, by M. Suzuki et al., Jap. J. Appl. Phy. 26 L524 (1987).
Compositional and Structural Analyses for Optimizing the Preparation Conditions of Superconducting Films, by M. Kawasaki et al., Jap. J. Appl. Phys. 26 L388 (1987).

*Primary Examiner*—Carl J. Arbes
*Attorney, Agent, or Firm*—Wegner, Cantor, Mueller & Player

[57] ABSTRACT

The superconductive thin film is made in the procedures that; in a vacuum vessel having an internal pressure maintained at least lower than $10^{-2}$ torr, each metal of the component elements of the superconductive thin film to be made is charged into a crucible so as to be heated as a simple substance respectively so that the evaporated metallic element is spouted from the crucible as a cluster beam, the spouted evaporation metallic element is ionized and accelerated through an electric field, impinging to a substrate while spouting oxygen gas toward the substrate, controlling the heating of the crucible so that the amount of the respective metallic evaporation beams is made to be a predetermined mole ratio, whereby the superconductive thin film is formed on the substrate.

7 Claims, 1 Drawing Sheet

PRODUCTION METHOD OF SUPERCONDUCTIVE THIN FILM AND A DEVICE THEREOF

This application is a continuation of U.S. Ser. No. 07/176,336 filed Mar 31, 1988 now abandoned.

BACKGROUND OF THE INVENTION

1. FIELD OF THE INVENTION

The present invention relates to a production method and device of superconductive thin film such as $Ba_{1-x}Y_xCuO_{1-y}$ which is utilized for various purposes.

2. DESCRIPTION OF THE PRIOR ART

There have been known various kinds of superconductive materials, which are utilized for various purposes such as Josephson junction devices and for others, and which are very important.

The superconductive materials mentioned above are generally made of oxide or carbonate, which have been conventionally produced by sintering or pressure molding of the powder of the oxide or carbonate.

However, any oxide of the components of said superconductive materials has a high melting point and it is difficult to form the thin film thereof. Therefore, each of the oxide or carbonate is processed by sintering or by pressure molding so as to form a plate shape thereof up to the present. Therefore, in the manner of the production method as mentioned above, it is difficult to obtain a superconductive thin film with good crystallization and adhesion, and though a sputtering method and MBE (Molecular Beam Epitaxial) method are considered as other methods of the art of forming the superconductive thin film, they are not satisfactory as an art of forming the thin film of superconductive materials of said components.

SUMMARY OF THE INVENTION

The present invention is made to solve the problem in the art of forming superconductive thin film as mentioned above, and the object of the present invention is to provide a production method and apparatus for superconductive thin film which can be made from the simple metallic substances of the component elements without using the oxides of high melting point, and having good adhesion when coating an object with said superconductive thin film.

As a means to solve the problem mentioned above, in the present invention there is adopted a production method for forming a superconductive thin film comprising following processes that; in a vacuum vessel having an internal pressure maintained at $10^{-2}$ torr or lower, each of the metallic component elements of the superconductive thin film to be made is charged into a crucible to be heated as a simple substance respectively so that each of the evaporated metallic elements is spouted out of the crucible as a cluster beam which is a beam or beams of a cluster of metallic molecules. Then, the spouted evaporated metallic element is ionized by electron beams. The ionized metallic beams are accelerated through electric fields so as to impinge the metallic beams onto a substrate while oxygen gas is spouted toward the substrate through a nozzle assembly. The heating of the crucible is controlled so that the amount of the respective metallic evaporation is made to be a predetermined mole ratio, whereby the superconductive thin film is formed.

Furthermore, according to the present invention, there is adopted an apparatus for performing the production method mentioned above, said apparatus comprising; a vacuum vessel having an internal pressure maintained at $1-^{-2}$ torr or less, closed type crucibles including heating devices, the crucibles being provided inside said vacuum vessel, the metallic component elements of the superconductive thin film to be made being respectively charged into said crucibles as a simple substance, thermionic beam generators ionizing the evaporated metallic elements which are spouted as cluster beams from one or a plurality of discharge tubes of said crucibles, accelerating plates for accelerating said ionized cluster metallic beams, and a nozzle assembly supplying oxygen to the ionized evaporation metallic beams.

The simple substance of each of the metallic elements charged into respective crucibles mentioned above is heated and evaporated by the heating device included in the crucible. The evaporating speed of said metallic substance in the crucible is controlled by adjusting the heating temperature of the crucible and the spouting intervals of the metallic elements evaporated in a throttle shape through discharge tubes of the crucibles, so that the composition formula of the metallic elements of the superconductive thin film, which is made by the vapor deposition of the evaporated metallic elements onto the substrate, is made to be a predetermined mole ratio such as $Ba_{1-x}Y_xCu_1$ when the metallic elements of the superconductive thin film are Ba, Y and Cu for example.

The metallic evaporation streams spouted as cluster beams from the crucibles are partially ionized respectively by thermionic beams radiated from thermionic beam generators.

The ionized metallic evaporation streams are immediately accelerated by negative voltage applied by means of accelerating plates. A certain degree of voltage is so selected as the above negative voltage as to obtain a stable deposition speed, although in some cases the accelerating voltage is not necessary.

Oxygen gas is supplied to the accelerated metallic evaporation stream mentioned above from a nozzle assembly before the evaporation beam is deposited onto the substrate. The oxygen gas is preferably supplied to the metallic evaporation beam within the range that the internal pressure of the vacuum vessel is $10^{-2}$ torr or less, particularly lower than $10^{-3}$ torr. Upon controlling the heating temperature of the heating device in the crucible, the ratio of the metallic vapor pressure P inside the crucible to the internal pressure $P_0$ of the vacuum vessel maintained as mentioned above can be obtained to be $P/P_0 \geq 10^2$, preferably $P/P_0 \geq 10^4$, whereby the evaporation stream spouted from the crucible can be made into a cluster beam. The above mentioned cluster beam loosely combined by the Van der Waals force acts as a monovalent ion and has an effect on the improvement of the crystallization when producing the superconductive thin film. Moreover, said ionized cluster beam is accelerated by the accelerating plate in the electric field and is impinged to the substrate increasing the momentum thereof so as to improve the adhesion force thereof.

DETAILED DESCRIPTION OF THE PREFERRED EMBODIMENT

Figure 1:
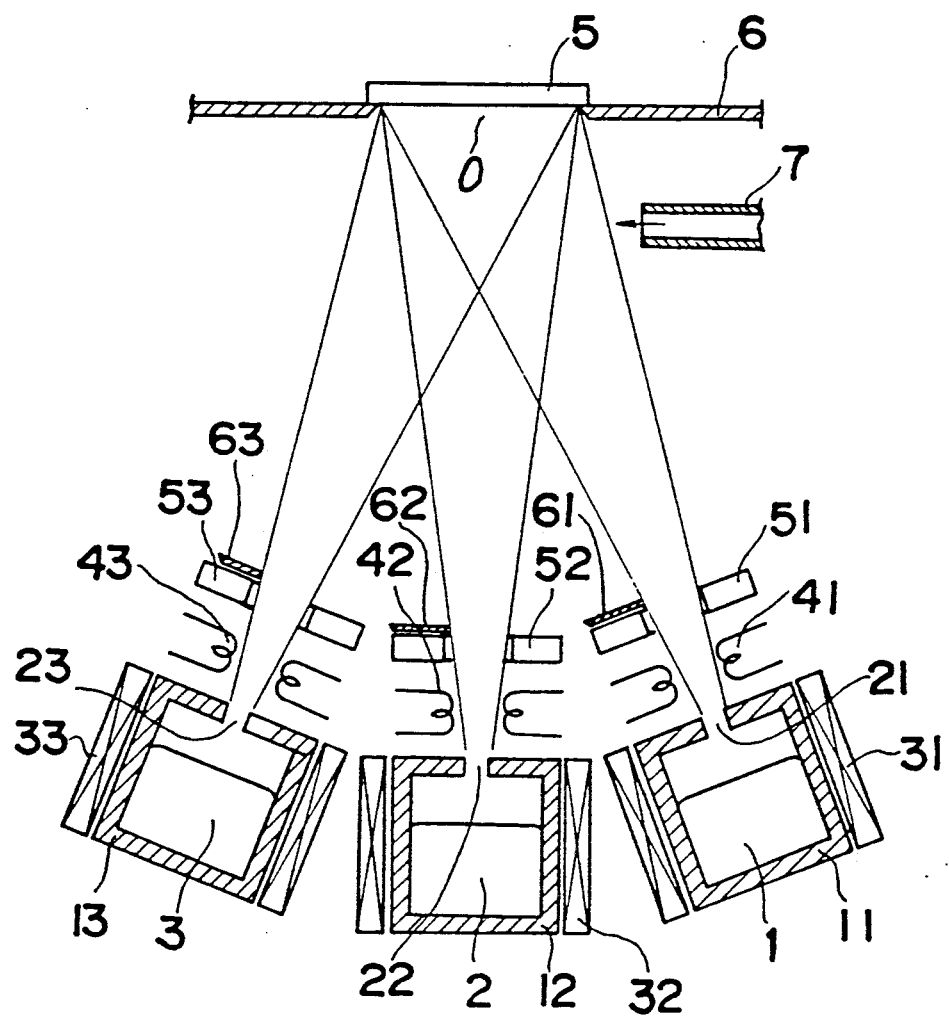
FIG. 1 is a schematic view of a device for producing superconductive thin film according to the present invention.

A device performing a method for producing superconductive thin film according to the present invention will be explained in detail with reference to the attached drawing as follows.

FIG. 1 shows a schematic view of an essential part of a device for producing superconductive thin film of $Ba_{1-x}Y_xCuO_{1-y}$ applying a production method of superconductive thin film according to the present invention. The device is useful for also producing other types of superconductive films.

Reference numerals 1, 2 and 3 denote metallic materials, and in the present embodiment each of the metallic elements Ba, Y and Cu may be respectively used in a state of powder, flake or pellet. Each of the metallic elements 1, 2 and 3 is charged in separate closed type crucibles 11, 12 and 13 respectively as a substantially pure substance. In the closed type crucibles 11, 12 and 13, there are respectively provided one or plural discharge openings 21, 22 and 23 having a diameter of 0.5 to 2.0 mm for spouting said metallic elements respectively, each of the discharge tubes comprising shutters 61, 62, 63 for controlling the amount of the metallic evaporation stream to be spouted. Moreover, said crucibles 11, 12 and 13 respectively comprise heating devices 31, 32 and 33 for heating and spouting each of the metallic elements 1, 2 and 3. A resistance heating method or an electron impact method may be adopted as a heating method of said heating devices 31, 32 and 33.

Furthermore, the production device of the superconductive thin film comprises thermionic beam generators 41, 42 and 43 for radiating thermionic beams to the evaporated streams of metallic elements spouted from said crucibles so as to partially ionize the metallic streams. Accelerating plates 51, 52 and 53 also are provided for supply a negative voltage to said ionized metallic streams so as to impinge the ionized evaporation stream onto a substrate 5.

Oxygen gas should be continuously supplied to the ionized evaporation stream before the evaporation stream is deposited onto the substrate 5 by the accelerating plates 51, 52 and 53 (i.e., the metallic evaporation streams of cluster beam is impinged and adheres onto the substrate surface in a state of lamination layer). Therefore, a nozzle assembly 7 for supplying oxygen gas is provided in front of a holding portion 6 for holding the substrate 5.

Moreover, all of the component parts of the production device of the superconductive thin film are provided in a vacuum vessel (not shown). Any of quartz glass, sapphire, silicon, alumina or metallic oxide may be used as a substrate material, and quartz glass is adopted in the present embodiment.

The operation of the present embodiment constituted as described above will be explained as follows.

Each of the metallic elements Ba, Y and Cu charged respectively in the crucibles 11, 12 and 13 is heated and evaporated continuously by the heating devices 31, 32 and 33 respectively. The evaporation speed of the heated metallic elements in the crucibles 11, 12 and 13 is controlled by adjusting the heating temperature of the crucibles 11, 12 and 13 and the intervals of opening and closing the shutters 61, 62, 63 of the discharge openings 21, 22 and 23 are controlled, so that the superconductive thin film with a desired metallic composition ratio (e.g. $Ba_{0.6}Y_{0.4}Cu_1$) can be obtained.

Thermionic beams are radiated from the thermionic beam generators 41, 42 and 43 to the evaporation streams spouted from the crucibles 11, 12 and 13 with electric current of 100 to 300 mA for ionizing each metallic element so that the spouted evaporation streams are partially ionized. Next, the ionized evaporation stream beams are accelerated by negative voltage applied by the accelerating plates 51, 52 and 53. The negative voltage for accelerating the ionized evaporation beams is selected in a range of 0 KV to 10 KV so that a stable deposition speed can be obtained even when no voltage is applied, that is, the voltage is 0 KV. The evaporation stream beams are projected to the substrate 5 through an opening 0 of the holding plate 6.

Thus, oxygen gas is supplied toward the substrate 5 from the nozzle assembly 7 before said accelerated evaporation stream beams are deposited onto the substrate 5. The pressure of the oxygen gas is made $5 \times 10^{-4}$ torr and the temperature of the substrate 5 is maintained to be 200 to 300° C. in the present embodiment.

Under the vapor deposition condition as described above, the superconductive thin film of 1.2 μm thick was obtained. The obtained thin film represented perfect superconductivity in a critical temperature of 80K.

In the present embodiment, although the explanation is made in the case of producing the superconductive thin film of an oxide group of $Ba_{10x}Y_xCuO_{1-y}$ for example, it is obvious to the skilled art worker that the production method and device of the superconductive thin film according to the present invention can be adapted to the other composition group such as a group of BaLaCuO. In this case, the metallic elements Ba and Y in the present embodiment mentioned above may be partially or entirely displaced with the homologue elements respectively, for example, the element Ba of IIa group in the periodic table may be displaced with any of elements Ca, Sr or Mg, and the element Y of IIIa group may be displaced with any of elements La, Sr, Nd, Gd or Sc of the lanthanum group.

As described above in details, in the production method and device of superconductive thin film according to the present invention, since a simple metallic substance is evaporated, ionized and accelerated without using an oxide of high melting point, the superconductive thin film can be obtained having good crystallization, adhesion and stability, improving the characteristic of the critical temperature thereof.

What is claimed is:

1. A method for producing a superconductive thin film, comprising:
   providing heating crucibles in a vacuum vessel, each of the crucibles containing a single, substantially pure, metal component element of the film to be produced;
   maintaining the vacuum vessel at a pressure of $10^{-2}$ torr or less;
   heating the metals in the crucibles so that streams of evaporated metal are spouted from the crucibles;
   ionizing the stream of evaporated metal with electron beams to form at least partially ionized metallic streams;

accelerating the ionized streams through electric fields so as to impinge onto a substrate while supplying oxygen gas to the ionized streams; and controlling the heating of the crucibles so that the respective amounts of metallic vapor deposition are made in a predetermined mole ratio.

2. The method according to claim 1, wherein substantially pure Ba, Y and Cu are selected as the metal component elements of said superconductive thin film.

3. The method according to claim 2, wherein the Ba and Y are respectively partially or entirely displaced with homologue elements.

4. The method according to claim 2, wherein said predetermined mole ratio of the component elements Ba, Y and Cu is controlled respectively to be $1-x$, $x$ and 1.

5. The method according to claim 3, wherein said predetermined mole ratio of the component elements Ba, Y and Cu is controlled respectively to be $1-x$, $x$ and 1.

6. The method according to claim 1, wherein the streams of evaporated metal are cluster beams.

7. The method of claim 2, wherein the superconductive thin film produced has the formula:

$$Ba_{1-x}Y_xCuO_{1-y}.$$

* * * * *